United States Patent
Ko

(10) Patent No.: US 9,520,369 B2
(45) Date of Patent: Dec. 13, 2016

(54) POWER MODULE AND METHOD OF PACKAGING THE SAME

(71) Applicant: HYUNDAI MOBIS Co., Ltd., Seoul (KR)

(72) Inventor: Jae Hyun Ko, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 14/925,266

(22) Filed: Oct. 28, 2015

(65) Prior Publication Data

US 2016/0118314 A1    Apr. 28, 2016

(30) Foreign Application Priority Data

Oct. 28, 2014    (KR) .................. 10-2014-0147425

(51) Int. Cl.
| | |
|---|---|
| H01L 23/36 | (2006.01) |
| H01L 23/367 | (2006.01) |
| H01L 23/498 | (2006.01) |
| H01L 23/00 | (2006.01) |
| H01L 23/495 | (2006.01) |
| H01L 23/373 | (2006.01) |

(52) U.S. Cl.
CPC ......... *H01L 24/00* (2013.01); *H01L 23/49531* (2013.01); *H01L 23/49548* (2013.01); *H01L 23/3735* (2013.01); *H01L 23/49562* (2013.01); *H01L 2224/48091* (2013.01); *H01L 2224/73265* (2013.01); *H01L 2924/181* (2013.01)

(58) Field of Classification Search
CPC .................. H01L 2924/15787; H01L 23/5389; H01L 23/49562; H01L 23/49575; H01L 23/49524; H01L 23/49551; H01L 2224/73263
See application file for complete search history.

(56) References Cited

U.S. PATENT DOCUMENTS

| | | |
|---|---|---|
| 7,019,395 B2 | 3/2006 | Hirano et al. |
| 2015/0008253 A1* | 1/2015 | Yoon .................... B23K 20/026 228/179.1 |

* cited by examiner

*Primary Examiner* — Jasmine Clark
(74) *Attorney, Agent, or Firm* — NSIP Law

(57) ABSTRACT

Provided are a power module having an integrated power semiconductor and a method of packaging the same. The power module according to an aspect of the present invention includes a power semiconductor chip based on silicon and insulating substrates respectively disposed at both surfaces of the power semiconductor chip and including a metal pattern electrically and directly connected to the power semiconductor chip.

14 Claims, 6 Drawing Sheets

Prior Art

Prior Art

Prior Art

POWER MODULE AND METHOD OF PACKAGING THE SAME

CROSS-REFERENCE TO RELATED APPLICATION

This application claims priority to and the benefit of Korean Patent Application No. 10-2014-0147425, filed on Oct. 28, 2014, the disclosure of which is incorporated herein by reference in its entirety.

BACKGROUND

1. Field of the Invention

The present invention relates to a power module having an integrated power semiconductor and a method of packaging the same.

2. Discussion of Related Art

Power modules for a power supply among semiconductor devices have a problem in that heating values thereof are comparatively great.

As a substrate for mounting the power module, a substrate for a power module in which a metal plate is bonded on a ceramic substrate, such as an aluminum nitride substrate, is used, and a semiconductor chip, which is a power device, is mounted on the metal plate.

The power module has problems in that a heating value is great and a power loss occurs, and since the substrate is manufactured to have a relatively great thickness, the size of the power module also becomes relatively great.

According to a related art, a technique for improving an effect of a heat sink has been proposed by bi-directionally bonding an insulating substrate and lead frames in a structure of a power semiconductor package.

However, there are problems in that the degree of process complexity is increased due to an increase in the number of processes as well as a loss is generated when the lead frame and the insulating substrate are bonded, and failure factors are increased during a process of bonding wires to be connected with a ceramic chip.

SUMMARY OF THE INVENTION

The present invention is directed to a power module capable of reducing overall thermal resistance by replacing lead frames included in a power semiconductor package according to a related art with a metal pattern on an insulating substrate to reduce a thickness of a power semiconductor module package and a method of packaging the same.

According to an aspect of the present invention, there is provided a power module including a power semiconductor chip based on silicon, and insulating substrates respectively disposed at both surfaces of the power semiconductor chip and including a pattern electrically and directly connected to the power semiconductor chip.

According to another aspect of the present invention, there is provided a method of packaging a power module including performing metal patterning on a first surface of an insulating substrate, disposing a power semiconductor chip based on silicon under the first surface of the insulating substrate, and disposing and bonding a second surface of the insulating substrate under and with the power semiconductor chip.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will now be described more fully with reference to the accompanying drawings to clarify aspects, features, and advantages of the present invention. The invention may, however, be embodied in many different forms and should not be construed as being limited to the embodiments set forth herein. Rather, these embodiments are provided so that this disclosure will be through and complete, and will fully convey the concept of the invention to those of ordinary skill in the art. The present invention is defined by the appended claims. Meanwhile, the terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. Hereinafter, exemplary embodiments of the present invention will be described in detail with reference to the accompanying drawings.

For convenience of description, a configuration of a power semiconductor package according to a related art will be generally described, and then a power module according to the embodiment of the present invention and a method of packaging the same will be described.

Figure 1:
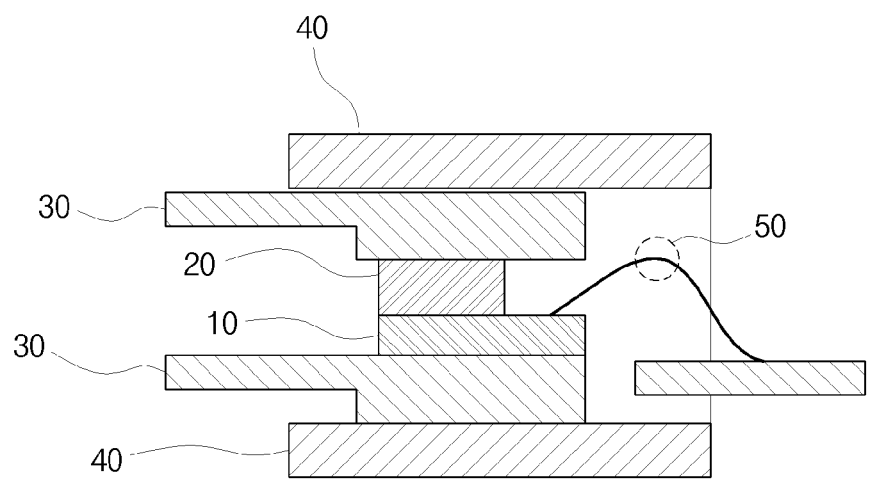
FIGS. 1 and 2 are cross-sectional views illustrating configurations of power module packages according to a related art.
Figure 2:
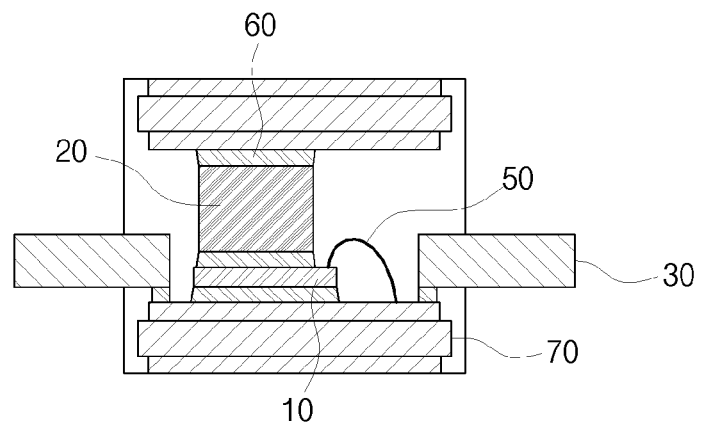

FIGS. 1 and 2 are cross-sectional views illustrating configurations of power module packages according to a related art.

As shown in FIG. 1, the power module package according to the related art has a package type in which a plurality of power semiconductors, such as an Insulated-Gate Bipolar Transistor (IGBT), a transistor such as a Metal oxide semiconductor field-effect transistor (MOSFET), a diode, etc., are integrated, and is formed with a power semiconductor chip 10 based on silicon, ceramics 40 which insulate the power semiconductor from the outside when the power semiconductor is operated, lead frames 30 provided with a pattern for a voltage/current, a heat spreader 20 disposed on the power semiconductor chip 10, and a conductive wire 50 for a winding connection between the power semiconductor chip 10 and a substrate.

The power module package is applied to switching components of a motor and a power converter, and serves to increase the degree of integration of a chip in order to minimize a heat loss during switching with a high voltage/high current.

The power module package according to the related art has problems in that a loss is high during a process of bonding lead frames and an insulating substrate, failure factors are increased according to a process of winding a conductive wire, and the number of overall processes is increased.

Figure 3:
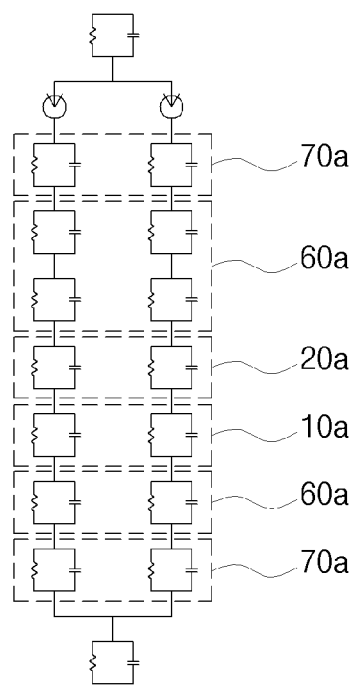
FIG. 3 is a circuit diagram illustrating thermal resistance components of the power module package according to the related art.

FIG. 2 is a cross-sectional view illustrating the configuration of the power module package according to the related art, and FIG. 3 is a circuit diagram illustrating thermal resistance components of the power module package shown in FIG. 2.

Each component is bonded by solder 60, and specific resistance components of each component and the solder are shown in FIG. 3. The thermal resistance components of a power semiconductor module package are formed with a resistance of an upper insulating substrate 70a, a resistance of the solder 60a, a resistance of a heat spreader 20a, a resistance of a power semiconductor chip 10a, and a resistance of a lower insulating substrate 70a.

Further, there is a problem in that the module package has a great thickness due to a stacked configuration.

Figure 4:
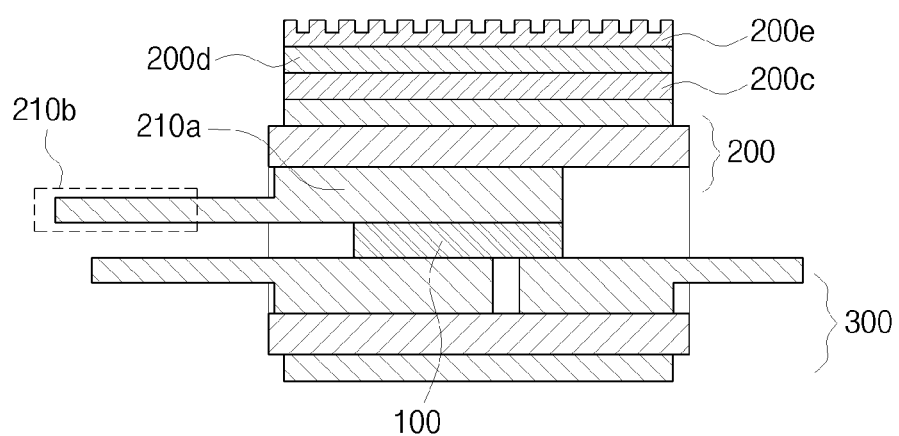
FIG. 4 is a cross-sectional view illustrating a configuration of a power module package according to an embodiment of the present invention.

FIG. 4 is a cross-sectional view illustrating a configuration of a power module package according to an embodiment of the present invention.

As shown in FIG. 4, a power module package according to the embodiment of the present invention includes a power semiconductor chip 100 based on silicon and insulating substrates 200 and 300 respectively disposed on both surfaces of the power semiconductor chip 100. Here, each of the insulating substrates 200 and 300 includes a metal pattern electrically and directly connected to the power semiconductor chip 100.

The insulating substrates 200 and 300 according to the embodiment of the present invention include an upper insulating substrate 200 disposed on an upper surface of the power semiconductor chip 100 and a lower insulating substrate 300 disposed on a lower surface of the power semiconductor chip 100, and the upper insulating substrate 200 is attached to the power semiconductor chip 100 using solder. Here, the upper insulating substrate 200 includes a metal pattern which is a wiring pattern electrically connected to the power semiconductor chip 100, and the metal pattern is formed of any one material of copper, a copper alloy, nickel plated copper, aluminum, and an aluminum alloy.

That is, the insulating substrates 200 and 300 according to the embodiment of the present invention include a metal pattern through which a current flows, are directly connected to the power semiconductor chip 100 using solder, and do not include a separate heat spreader therebetween.

The upper insulating substrate 200 according to the embodiment of the present invention includes an inner portion 210a disposed on a surface of power semiconductor chip using solder and having a metal pattern, and an outer portion 210b electrically connected to a power device outside the power module package. Here, a general battery is applied as the external power device.

Further, the power module is formed to further include a dielectric layer 200c formed on a surface of the upper insulating substrate 200 opposite a surface of the upper insulating substrate 200 on which a wiring pattern is formed, a heat sink layer 200d which covers the opposite surface, and a heat sink 200e attached to the heat sink layer using solder.

In the power module according to the embodiment of the present invention, the metal pattern is applied to a metal used for a top pattern of the insulating substrate included in the package structure to replace the lead frames used in the related art, and thus a process of bonding lead frames is omitted, a process of connecting conductive wires is omitted, and a separate heat spreader is not provided.

Accordingly, an overall thickness of the module package is reduced, and thus thermal resistance is improved by reducing thermal resistance components, and there is an advantage of cost saving for the power module packaging by omitting some components such as conventional lead frames, conductive wires, and a heat spreader.

Figure 5:
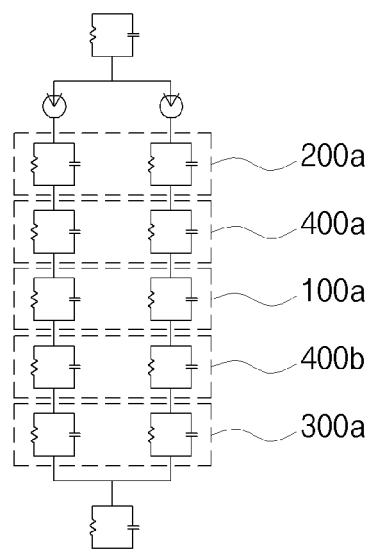
FIG. 5 is a circuit diagram illustrating thermal resistance components of the power module package according to the embodiment of the present invention.

FIG. 5 is a circuit diagram illustrating thermal resistance components of the power module package according to the embodiment of the present invention.

That is, as shown in FIG. 5, the thermal resistance of the power module package according to the embodiment of the present invention includes a resistance of an upper insulating substrate 200a, a resistance of a solder 400a which is a bonder bonding the upper insulating substrate and a power semiconductor chip, a resistance of the power semiconductor chip 100a, a resistance of a solder 400b which is a bonder bonding a lower insulating substrate and the power semiconductor chip, a resistance of a lower insulating substrate 300a, and a resistance of a heat sink.

That is, when the thermal resistance component of the power module package according to the related art shown in FIG. 3 and the thermal resistance component of the power module package according to the embodiment of the present invention shown in FIG. 5 are compared, the conventional configuration is replaced with the insulating substrates including the metal pattern according to the embodiment of the present invention, thermal resistance is reduced, and thus an effect of the heat sink can be improved.

Figure 6:
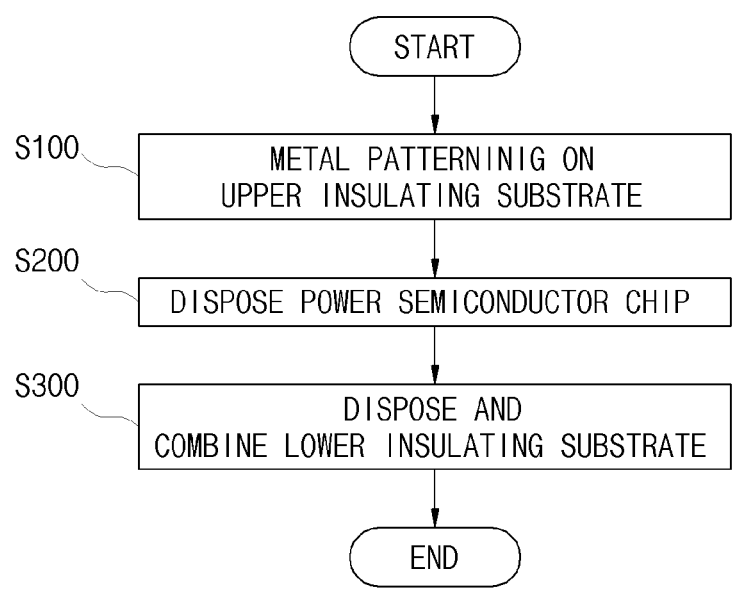
FIG. 6 is a flowchart illustrating a method of packaging a power module according to the embodiment of the present invention.

FIG. 6 is a flowchart illustrating a method of packaging a power module according to the embodiment of the present invention.

The method of packaging the power module according to the embodiment of the present invention includes performing metal patterning on an upper insulating substrate (S100), disposing a power semiconductor chip based on silicon under the upper insulating substrate (S200), and disposing and bonding a lower insulating substrate under and with the power semiconductor chip (S300).

In operation S100, a metal pattern, which is a wiring pattern electrically connected to the power semiconductor chip, is formed. The metal pattern designed by a designer is formed on a portion (an inner portion) of the insulating substrate in contact with the power semiconductor chip, and an outer portion of the insulating substrate is connected to an external power device.

In operation S100, the metal pattern is formed of any one material of copper, a copper alloy, nickel plated copper, aluminum, and an aluminum alloy, and copper is applied as a typical material.

That is, according to the embodiment of the present invention, since the lead frames used in the related art are replaced with the insulating substrates including the metal pattern, processes of bonding lead frames, attaching a heat spreader, and connecting conductive wires are omitted, and thus an overall packaging process is simplified and there is an advantage to prevent a loss generated when a process used in the related art is performed.

According to the embodiment of the present invention, as described above through comparison between those shown in FIGS. 3 and 5, when the embodiment is compared with a method of packaging a power module according to the related art, the embodiment can reduce specific resistance components serially connected in a stacked structure, and thus there are advantages of reducing the thickness of the power module package and reducing the thermal resistance component.

As described above, according to the power module according to the embodiment of the present invention and the method of packaging the same, since a metal pattern applied as a top pattern of an insulating substrate can replace lead frames used in a related art, an overall thickness of the power semiconductor module package is reduced, thermal resistance is decreased, and thus an effect of a heat sink is improved.

According to the power module according to the embodiment of the present invention and the method of packaging the same, since a metal pattern formed on a substrate can be modified according to a design, a power module having a small power loss can be provided by using a pattern design by which a maximum current can flow.

Further, since a process of bonding lead frames, connecting conductive wires, and attaching a heat spreader according to the related art is omitted, an overall process can be simplified and a cost of power module manufacture can be saved.

Advantages of the present invention are not limited to the above descriptions, and the other advantages not described above will be checked and clearly understood through the detailed description of exemplary embodiments.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A power module comprising:
    a power semiconductor chip based on silicon;
    an upper insulating substrate disposed on an upper surface of the power semiconductor chip;
    a pattern formed on a first surface of the upper insulating substrate, the pattern being electrically and directly connected to the power semiconductor chip; and
    a dielectric layer formed on a second surface of the upper insulating substrate, the second surface being opposite of the first surface.

2. The power module of claim 1, further comprising a lower insulating substrate disposed on a lower surface of the power semiconductor chip.

3. The power module of claim 1, wherein the insulating substrates are directly connected to the power semiconductor chip via solder.

4. The power module of claim 2, wherein the pattern is a metal wiring pattern.

5. The power module of claim 4, wherein the upper insulating substrate further comprises:
    an inner portion, wherein the pattern is disposed on a surface of the inner portion; and
    an outer portion electrically connected to a power device outside of a package.

6. The power module of claim 4, wherein the pattern is made of any one of copper, copper alloy, nickel plated copper, aluminum, or aluminum alloy.

7. The power module of claim 1, further comprising:
    a heat sink layer configured to cover the second surface; and
    a heat sink attached to the heat sink layer via solder.

8. A method of packaging a power module, comprising:
    forming a pattern on a first surface of an upper insulating substrate;
    disposing a power semiconductor chip based on silicon under the upper insulating substrate;
    disposing and bonding a lower insulating substrate under the power semiconductor chip; and
    forming a dielectric layer on a second surface of the upper insulating substrate opposite the first surface.

9. The method of claim 8, wherein the pattern is a metal pattern electrically and directly connected to the power semiconductor chip.

10. The method of claim 9, wherein the pattern is made of any one of copper, copper alloy, nickel plated copper, aluminum, or aluminum alloy.

11. The method of claim 8, wherein an outer portion of the upper insulating substrate is electrically connected to a power device outside a package.

12. The method of claim 8, wherein the insulating substrates and the power semiconductor chip are directly attached via solder.

13. The method of claim 8, wherein the disposing and bonding the lower insulating substrate further comprises forming a heat sink layer configured to cover the second surface, and attaching a heat sink.

14. A power module comprising:
    a power semiconductor chip based on silicon;
    an upper insulating substrate disposed on an upper surface of the power semiconductor chip;
    a pattern formed on a first surface of the upper insulating substrate, the pattern being electrically and directly connected to the power semiconductor chip;
    a dielectric layer formed on a second surface of the upper insulating substrate, the second surface being opposite of the first surface;
    a heat sink layer configured to cover the second surface; and
    a heat sink attached to the heat sink layer using solder.

* * * * *